US012707685B2

(12) United States Patent
Reilly

(10) Patent No.: US 12,707,685 B2
(45) Date of Patent: Aug. 11, 2026

(54) SEGMENTED TRANSISTOR ACTIVE REGION FOR ENHANCED THERMAL CONDUCTIVITY

(71) Applicant: Raytheon Company, Waltham, MA (US)

(72) Inventor: Caroline Reilly, Chapel Hill, CT (US)

(73) Assignee: RAYTHEON TECHNOLOGIES CORPORATION, Arlington, VA (US)

( * ) Notice: Subject to any disclaimer, the term of this patent is extended or adjusted under 35 U.S.C. 154(b) by 493 days.

(21) Appl. No.: 18/191,954

(22) Filed: Mar. 29, 2023

(65) Prior Publication Data

US 2024/0332355 A1 Oct. 3, 2024

(51) Int. Cl.

| | |
|---|---|
| ***H10D 62/10*** | (2025.01) |
| ***H10D 30/43*** | (2025.01) |
| ***H10D 62/85*** | (2025.01) |
| ***H10P 14/20*** | (2026.01) |
| ***H10W 44/20*** | (2026.01) |

(52) U.S. Cl.

CPC ....... *H10D 62/121* (2025.01); *H10D 62/8503* (2025.01); *H10P 14/3216* (2026.01); *H10W 44/20* (2026.01); *H10D 30/435* (2025.01); *H10W 44/226* (2026.01)

(58) Field of Classification Search

CPC ............. H10D 62/121; H10D 62/8503; H10D 62/813; H10D 30/435; H10D 30/014; H10D 62/405; H01L 23/66; H01L 2223/6644; H01L 21/02458; H01L 21/02603; H01L 21/02494; H10P 14/3466; H10P 14/2926; H10P 14/3258; H10P 14/3462; H10P 14/3216

See application file for complete search history.

(56) References Cited

U.S. PATENT DOCUMENTS 5,882,952 A * 3/1999 Kizuki .................. H10D 30/47 977/760

5,886,360 A * 3/1999 Ochi ................ H01L 21/02507 257/14

(Continued)

FOREIGN PATENT DOCUMENTS

| | | | |
|---|---|---|---|
| EP | 3539159 | B1 | 5/2022 |
| WO | 2018087728 | A1 | 5/2018 |
| WO | 2018119037 | A1 | 6/2018 |

OTHER PUBLICATIONS

International Search Report with Written Opinion issued in International Application No. PCT/US2024/020196; International Filing Date Mar. 15, 2024; Date of Mailing Jul. 15, 2024 (11 pages).

(Continued)

*Primary Examiner* — Julio J Maldonado

*Assistant Examiner* — Nathan Pridemore

(74) *Attorney, Agent, or Firm* — CANTOR COLBURN LLP

(57) ABSTRACT

A semiconductor device is provided and includes a miscut substrate, intermediate layers epitaxially grown on the miscut substrate such that an uppermost surface of the intermediate layers includes surface steps, segmented active regions including nanowire channels, each of which is epitaxially grown on a corresponding one of the surface steps and a cap layer epitaxially grown on the nanowire channels and exposed portions of the uppermost surface.

13 Claims, 4 Drawing Sheets

(56) References Cited

U.S. PATENT DOCUMENTS

| | | | | |
|---|---|---|---|---|
| 7,569,470 | B2 | 8/2009 | Fernandez-Ceballos et al. | |
| 10,439,059 | B2 | 10/2019 | Palacios et al. | |
| 10,985,253 | B2 | 4/2021 | Matioli et al. | |
| 2007/0018198 | A1* | 1/2007 | Brandes | H10D 30/4755 257/E29.253 |
| 2008/0206936 | A1* | 8/2008 | Fernandez-Ceballos | H01L 21/76838 977/932 |
| 2018/0090603 | A1* | 3/2018 | Yamada | H01L 21/0254 |
| 2020/0343375 | A1* | 10/2020 | Mishra | H10D 30/478 |
| 2022/0344462 | A1* | 10/2022 | Dangel | H10D 62/118 |
| 2024/0154030 | A1* | 5/2024 | Cheng | H10D 62/117 |

OTHER PUBLICATIONS

Chan et al., "Growth by MOCVD and photoluminescence of semipolar (2021) InN quantum dashes" Journal of Crystal Growth 563 (Jun. 2021): 126093 (4 pages).

Darwish et al., "AlGaN/GaN HEMT with distributed gate for channel temperature reduction" IEEE transactions on microwave theory and techniques 60.4 (Apr. 2012) pp. 1038-1043.

He et al., "Enhancement-mode AlGaN/GaN nanowire channel high electron mobility transistor with fluorine plasma treatment by ICP" IEEE Electron Device Letters 38.10 (Aug. 2017) pp. 1421-1424.

Lee et al., "High linearity nanowire channel GaN HEMTs" 71st Device Research Conference. IEEE, (Jun. 2013) pp. 195-196.

Lee et al., "Nanowire Channel InAlN/GaN HEMTs With High Linearity of gm and fT" IEEE electron device letters 34.8 (Jun. 2013) pp. 969-971.

Lund et al., "Metal-organic chemical vapor deposition of N-polar InN quantum dots and thin films on vicinal GaN" Journal of Applied Physics 123.5 (Feb. 2018) (9 pages).

Xing et al., "Planar-Nanostrip-Channel InAlN/GaN HEMTs on Si With Improved and Linearity" IEEE Electron Device Letters 38.5 (Mar. 2017) pp. 619-622.

* cited by examiner 101
140
130
131
111
110
121
120
112
P
150
152
151
122
130/140

SEGMENTED TRANSISTOR ACTIVE REGION FOR ENHANCED THERMAL CONDUCTIVITY

BACKGROUND

The present disclosure relates to semiconductor devices and to a segmented transistor active region for enhanced thermal conductivity.

A radio frequency (RF) transistor is a semiconductor device used to amplify and switch electronic signals. An RF transformer can be seated between two or more circuits and can use changes of electric signals and the principle of induction in a conductor to produce a varying magnetic field (flux) that couples energy through to another conductor.

In operation, RF transistors tend to heat up, which reduces a device lifetime. Therefore, a need remains for RF transistors that do not exhibit self-heating.

SUMMARY

According to an aspect of the disclosure, a semiconductor device is provided and includes a miscut substrate, intermediate layers epitaxially grown on the miscut substrate such that an uppermost surface of the intermediate layers includes surface steps, segmented active regions including nanowire channels, each of which is epitaxially grown on a corresponding one of the surface steps and a cap layer epitaxially grown on the nanowire channels and exposed portions of the uppermost surface.

In accordance with additional or alternative embodiments, there is an absence of high thermal boundary resistance between the nanowire channels, the intermediate layers and the cap layer.

In accordance with additional or alternative embodiments, cross-sectional shapes of the segmented active regions are one or more of triangular, square, rectangular and trapezoidal and the intermediate layers and the nanowire channels have various crystallographic orientations including at least one or more of N-polar, Ga-polar, m-plane and semipolar.

In accordance with additional or alternative embodiments, the intermediate layers, the cap layer and the nanowire channels each include at least one or more of aluminum nitride, gallium nitride, indium nitride, aluminum gallium nitride and alloys thereof and indium gallium nitride and alloys thereof.

In accordance with additional or alternative embodiments, the segmented active regions are provided in multiple layers.

In accordance with additional or alternative embodiments, source and drain regions are disposed in electrical communication with opposite ends of each of the nanowire channels and a gate structure is disposed between the source and drain regions and about each of the nanowire channels.

According to an aspect of the disclosure, a method of building a semiconductor device is provided. The method includes providing a miscut substrate, epitaxially growing intermediate layers on the miscut substrate such that an uppermost surface of the intermediate layers includes surface steps, epitaxially growing nanowire channels, with each nanowire channel being epitaxially grown on a corresponding one of the surface steps to form segmented active regions and epitaxially growing a cap layer on the nanowire channels and exposed portions of the uppermost surface.

In accordance with additional or alternative embodiments, the epitaxially growing of the intermediate layers, the nanowire channels and the cap layer includes metalorganic chemical vapor deposition (CVD).

In accordance with additional or alternative embodiments, materials of the epitaxially growing of the intermediate layers, the cap layer and the nanowire channels include at least one or more of aluminum nitride, gallium nitride, indium nitride, aluminum gallium nitride and alloys thereof and indium gallium nitride and alloys thereof and precursor materials include at least one or more of trimethylaluminium, trimethylgallium, triethylgallium, trimethylindium, triethylindium, ammonia, hydrazine, and dimethylhydrazine.

In accordance with additional or alternative embodiments, the epitaxially growing of the intermediate layers, the nanowire channels and the cap layer is continuous.

In accordance with additional or alternative embodiments, the epitaxially growing of the intermediate layers, the nanowire channels and the cap layer includes one or more of N-polar growth, Ga-polar growth, m-plane growth and semipolar growth.

In accordance with additional or alternative embodiments, the epitaxially growing of the nanowire channels is executed such that the segmented active regions are provided in multiple layers.

In accordance with additional or alternative embodiments, the method further includes disposing source and drain regions in electrical communication with opposite ends of each of the nanowire channels and disposing a gate structure between the source and drain regions and about each of the nanowire channels.

According to an aspect of the disclosure, a method of building a semiconductor device is provided. The method includes providing a planarized substrate, epitaxially growing intermediate layers on the planarized substrate, forming surface steps in an uppermost surface of the intermediate layers, epitaxially growing nanowire channels, with each nanowire channel being epitaxially grown on a corresponding one of the surface steps to form segmented active regions and epitaxially growing a cap layer on the nanowire channels and exposed portions of the uppermost surface.

In accordance with additional or alternative embodiments, the epitaxially growing of the intermediate layers, the nanowire channels and the cap layer includes metalorganic chemical vapor deposition (CVD).

In accordance with additional or alternative embodiments, materials of the epitaxially growing of the intermediate layers, the cap layer and the nanowire channels include at least one or more of aluminum nitride, gallium nitride, indium nitride, aluminum gallium nitride and alloys thereof and indium gallium nitride and alloys thereof and precursor materials include at least one or more of trimethylaluminium, trimethylgallium, triethylgallium, trimethylindium, triethylindium, ammonia, hydrazine, and dimethylhydrazine.

In accordance with additional or alternative embodiments, at least the epitaxially growing of the nanowire channels and the cap layer is continuous.

In accordance with additional or alternative embodiments, the epitaxially growing of the intermediate layers, the nanowire channels and the cap layer includes one or more of N-polar growth, Ga-polar growth, m-plane growth and semipolar growth.

In accordance with additional or alternative embodiments, the epitaxially growing of the nanowire channels is executed such that the segmented active regions are provided in multiple layers.

In accordance with additional or alternative embodiments, the method further includes disposing source and drain regions in electrical communication with opposite ends of each of the nanowire channels and disposing a gate structure between the source and drain regions and about each of the nanowire channels.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figures 1A, 1B, 2A, 2B, 3:
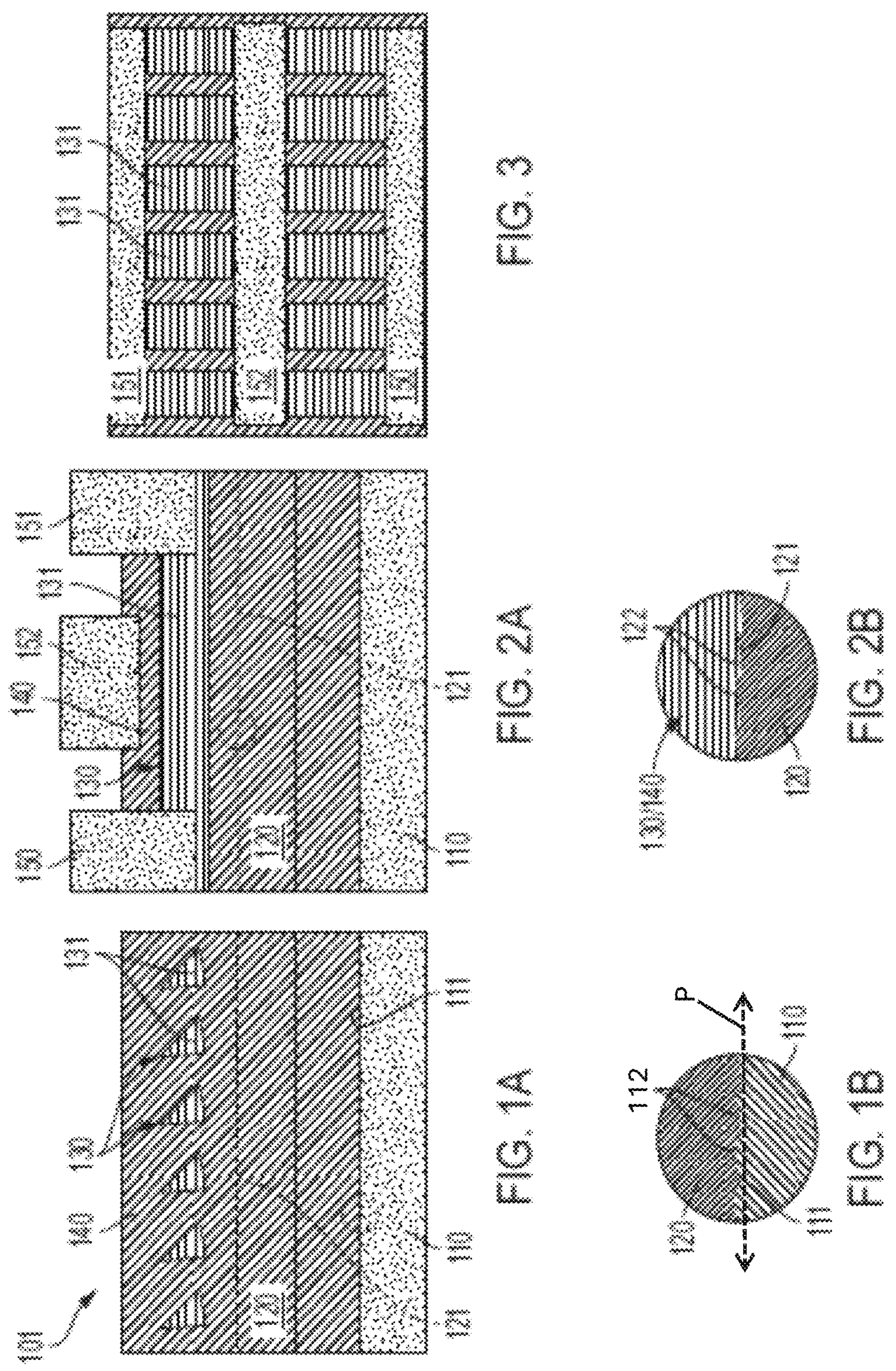
FIG. 1A is an axial view of a semiconductor device in accordance with embodiments.
FIG. 1B is an enlarged view of a surface of a miscut substrate of the semiconductor device of FIG. 1A, which is encircled by the dashed line, in accordance with embodiments.
FIG. 2A is a side view of the semiconductor device of FIG. 1A in accordance with embodiments.
FIG. 2B is an enlarged view of a surface of a miscut substrate of the semiconductor device of FIG. 2A, which is encircled by the dashed line, in accordance with embodiments.
FIG. 3 is a top-down view of the semiconductor device of FIG. 1A without a cap layer in accordance with embodiments.
Figure 7:
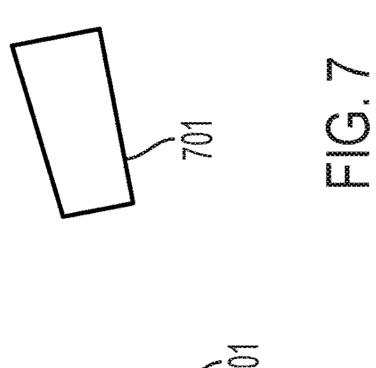
FIG. 7 is a schematic cross-sectional view of a trapezoidal nanowire channel in accordance with embodiments.
Figure 6:
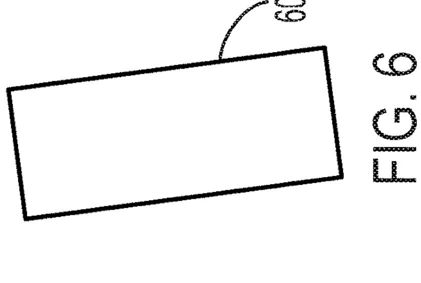
FIG. 6 is a schematic cross-sectional view of a rectangular nanowire channel in accordance with embodiments.
Figure 5:
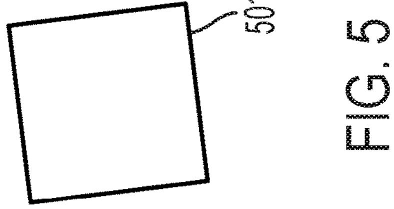
FIG. 5 is a schematic cross-sectional view of a square nanowire channel in accordance with embodiments
Figure 4:
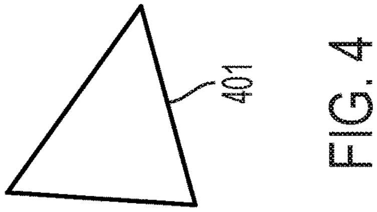
FIG. 4 is a schematic cross-sectional view of a triangular nanowire channel in accordance with embodiments.

Semiconductor devices, such as transistors for RF applications often require higher power densities under higher frequency operation. During such higher power density operation, device lifetimes tend to drop due to device self-heating phenomena. To maintain high device lifetimes, active region temperatures need to be reduced. In gallium nitride (GaN) high electron mobility transistors (HEMTs), for example, the device includes epitaxial layers/sheets whose interfaces have high thermal boundary resistances which contribute to elevated temperatures of active regions. As such, in HEMTs, reduction of active region temperatures remains a challenge.

Thus, as will be described below, a semiconductor device, such as an RF transistor device, is provided with a segmented active region in which interfaces between buffer and cap layers are removed to allow for more effective heat transfer through the semiconductor device. This structure can be applied to a variety of material combinations and crystal orientations. Active region segmentation can be achieved through self-assembled nanowire growth on vicinal substrates, where the surface steps naturally provide segmentation. This creates a truncated two-dimensional electron gas (2 DEG) which may be considered a 1 DEG with channel conduction parallel to the source-drain.

With reference to FIGS. 1A and 1B, FIGS. 2A and 2B and FIG. 3, a semiconductor device (hereinafter referred to as an exemplary "RF transistor device") 101 is provided and includes a miscut substrate 110, which has an uppermost surface 111 with miscut sections 112 that are angled relative to the horizontal plane P (i.e., by about) 2°-4°, intermediate layers 120, segmented active regions 130 and a cap layer 140. The intermediate layers 120 are epitaxially grown on the uppermost surface 111 of the miscut substrate 110 such that the formations of the miscut sections 112 cause the intermediate layers 120 to grow in such a manner that an uppermost surface 121 of the intermediate layers 120 includes surface steps 122. The surface steps 122 generally mimic the formation of the miscut sections 112. In this way, the surface steps 122 can be regarded as a vicinal substrate whose surface at the surface steps deviates from a major crystallographic axis. The segmented active regions 130 can be provided as one of fully strained, partially relaxed and fully relaxed and can include nanowire channels 131. Each of the nanowire channels 131 is epitaxially grown or self-assembled on a corresponding one of the surface steps 122, which results in each of the nanowire channels 131 having a particular cross-sectional shape (see FIGS. 4, 5, 6 and 7). The cap layer 140 is epitaxially grown on the nanowire channels 131 and on exposed portions of the uppermost surface 121.

In accordance with embodiments, materials of the intermediate layers 120, the segmented active regions 130, the nanowire channels 131 and the cap layer 140 can include at least one or more of aluminum nitride, gallium nitride, indium nitride, aluminum gallium nitride and alloys thereof and indium gallium nitride and alloys thereof.

As shown in FIG. 3, the RF transistor device 101 can further include source and drain regions 150 and 151, which are disposed in electrical communication with opposite ends of each of the segmented active regions 130 and each of the nanowire channels 131, and a gate structure 152. The gate structure 152 is disposed between the source and drain regions 150 and 151 and about each of the segmented active regions 130 and each of the nanowire channels 131.

In accordance with embodiments, the miscut substrate 110 can be reformulated as a planarized substrate. In these or other cases, the surface steps 122 of the uppermost surface 121 can be etched or machined into the uppermost surface 121. This will result in a same overall configuration of the segmented active regions 130 and the nanowire channels 131 as that described above.

With the construction described above, the RF transistor device 101 is characterized in that it has an absence of high thermal boundary resistance between the uppermost surface 121 of the intermediate layers 120 and the cap layer 140. As such, heat from the nanowire channels 131 is met with little or substantially reduced resistance after transferring to the surrounding materials and a resulting temperature of the RF transistor device 101 can be reduced. This heat transfer characteristic will be present in cases in which the intermediate layers 120 and the cap layer 140 are formed of similar materials, such as aluminum nitride, and the nanowire channels 131 are formed of gallium nitride and/or or when the intermediate layers 120 and the cap layer 140 are formed of differing materials. In the cases in which the intermediate layers 120 and the cap layer 140 are formed of differing materials, there remains fewer interfaces as compared to a situation in which the active region is not segmented.

With additional reference to FIGS. 4-7, the intermediate layers 120 and the nanowire channels 131 can have various crystallographic orientations owing to the formation of the miscut sections 112 of the miscut substrate 110 or where the intermediate layers 120 and the nanowire channels 131 are formed on a semipolar substrate that shows large surface steps. Th various crystallographic orientations can include, but are not limited to, one or more of N-polar, Ga-polar, m-plane and semipolar. In any case, due to the nanowire channels 131 being epitaxially grown or self-assembled on the surface steps 122 of the uppermost surface 121, the cross-sectional shapes of the segmented active regions 130 and the nanowire channels 131 can be one or more of triangular 401, square 501, rectangular 601 and trapezoidal 701 or other regular or irregular shapes.

Figure 8:
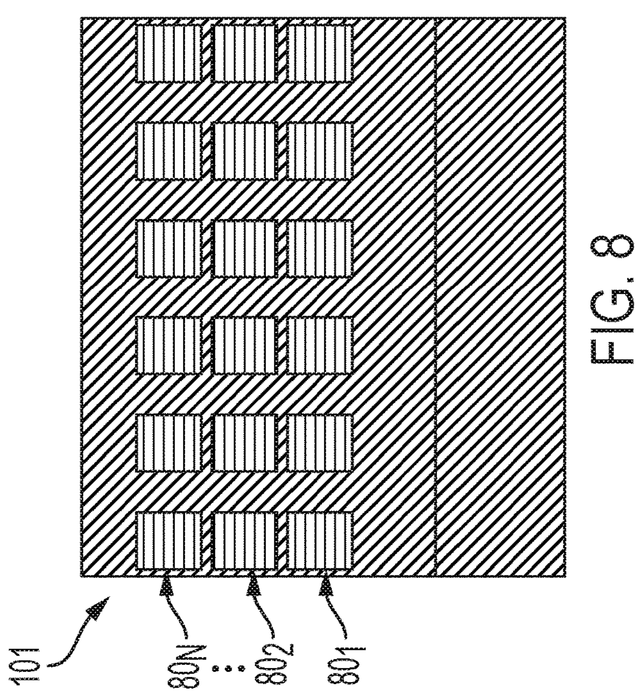
FIG. 8 is an axial view of a semiconductor device with multiple layers of segmented active regions and nanowire channels in accordance with embodiments.

With reference to FIG. 8 and in accordance with further embodiments, the segmented active regions 130 and the nanowire channels 131 can be provided in multiple layers 801, 802, . . . , 80N. Numbers of the multiple layers can be increased or decreased to satisfy various requirements of the RF transistor device 101.

Figure 9:
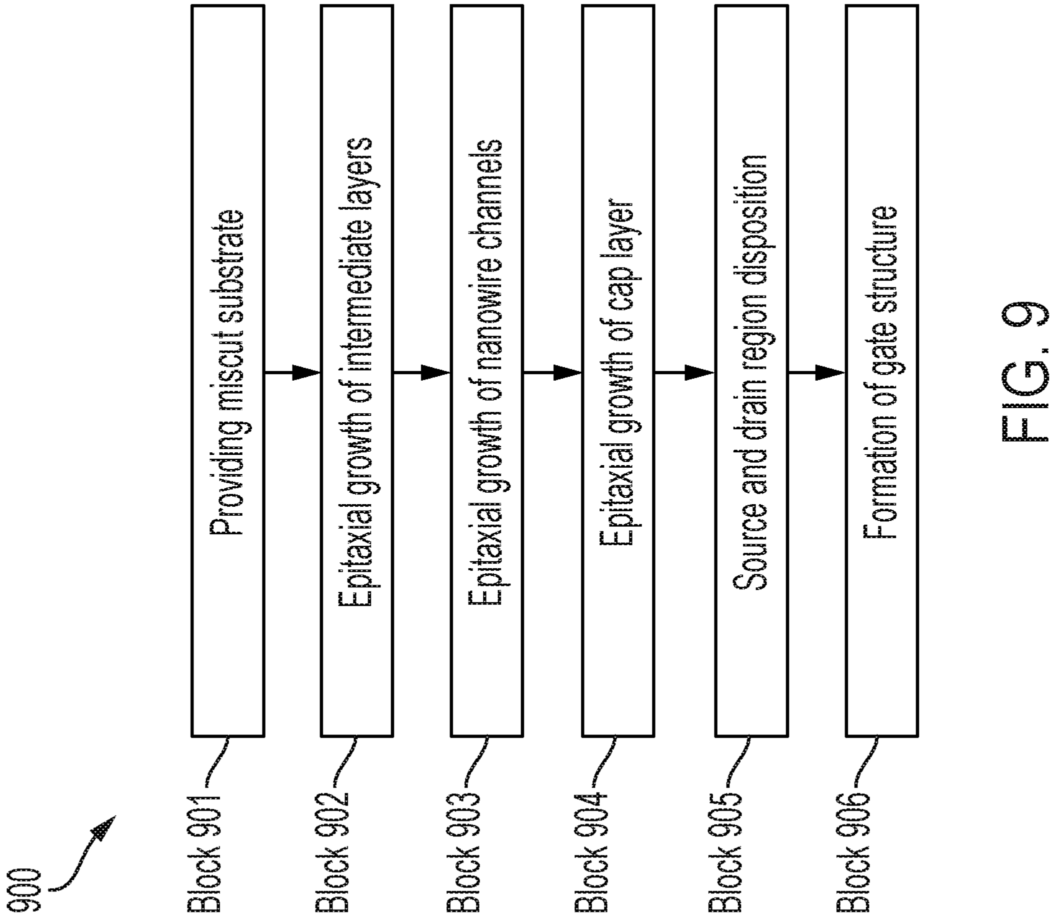
FIG. 9 is a flow diagram illustrating a method of building a semiconductor device with a miscut substrate in accordance with embodiments.

With reference to FIG. 9, a method 900 of building an RF transistor device, such as the RF transistor device 101 described above, is provided. The method 900 includes providing a miscut substrate (block 901), epitaxially growing intermediate layers on the miscut substrate such that an uppermost surface of the intermediate layers comprises surface steps (block 902), epitaxially growing nanowire channels, with each nanowire channel being epitaxially grown on a corresponding one of the surface steps to form segmented active regions (block 903) and epitaxially growing a cap layer on the nanowire channels and exposed portions of the uppermost surface (block 904).

The method 900 can further include disposing source and drain regions in electrical communication with opposite ends of each of the nanowire channels (block 905) and disposing a gate structure between the source and drain regions and about each of the nanowire channels (block 906).

In accordance with embodiments, the epitaxially growing of the intermediate layers, the nanowire channels and the cap layer of blocks 902, 903 and 904 can be conducted via metalorganic chemical vapor deposition or metalorganic vapor phase epitaxy and can be executed in a continuous manner. Such continuous epitaxial growth can be enabled by switching between precursor materials without removal of wafer material from the growth chamber and proceeding with epitaxial growth without stopping or at least without stopping for any significant amount of time. The continuous epitaxial growth contributes significantly to the absence of impurities at the interface associated with removal of the wafer from the growth chamber, which is often done when having to pattern the material. These impurities reduce the performance of the device.

In accordance with further embodiments, materials used in the epitaxially growing of the intermediate layers, the nanowire channels and the cap layer of blocks 902, 903 and 904 can include at least one or more of aluminum nitride, gallium nitride, indium nitride, aluminum gallium nitride and alloys thereof and indium gallium nitride and alloys thereof. Precursor materials can include at least one or more of trimethylaluminium, trimethylgallium, triethylgallium, trimethylindium, triethylindium, ammonia, hydrazine, and dimethylhydrazine.

The epitaxially growing of the intermediate layers, the nanowire channels and the cap layer of blocks 902, 903 and 904 results in a self-assembled formation of a segmented channel region that would otherwise need to be formed via a process of etching or regrowth. Those conventional processes would tend to introduce damage and/or impurities near sensitive portions of the device and thus degrade performance.

In accordance with embodiments, the epitaxially growing of the intermediate layers, the nanowire channels and the cap layer of blocks 902, 903 and 904 can include one or more of N-polar growth, Ga-polar growth, m-plane growth and semipolar growth. In addition, the epitaxially growing of the nanowire channels of block 903 can be executed such that the segmented active regions and the nanowire channels are provided in multiple layers.

Figure 10:
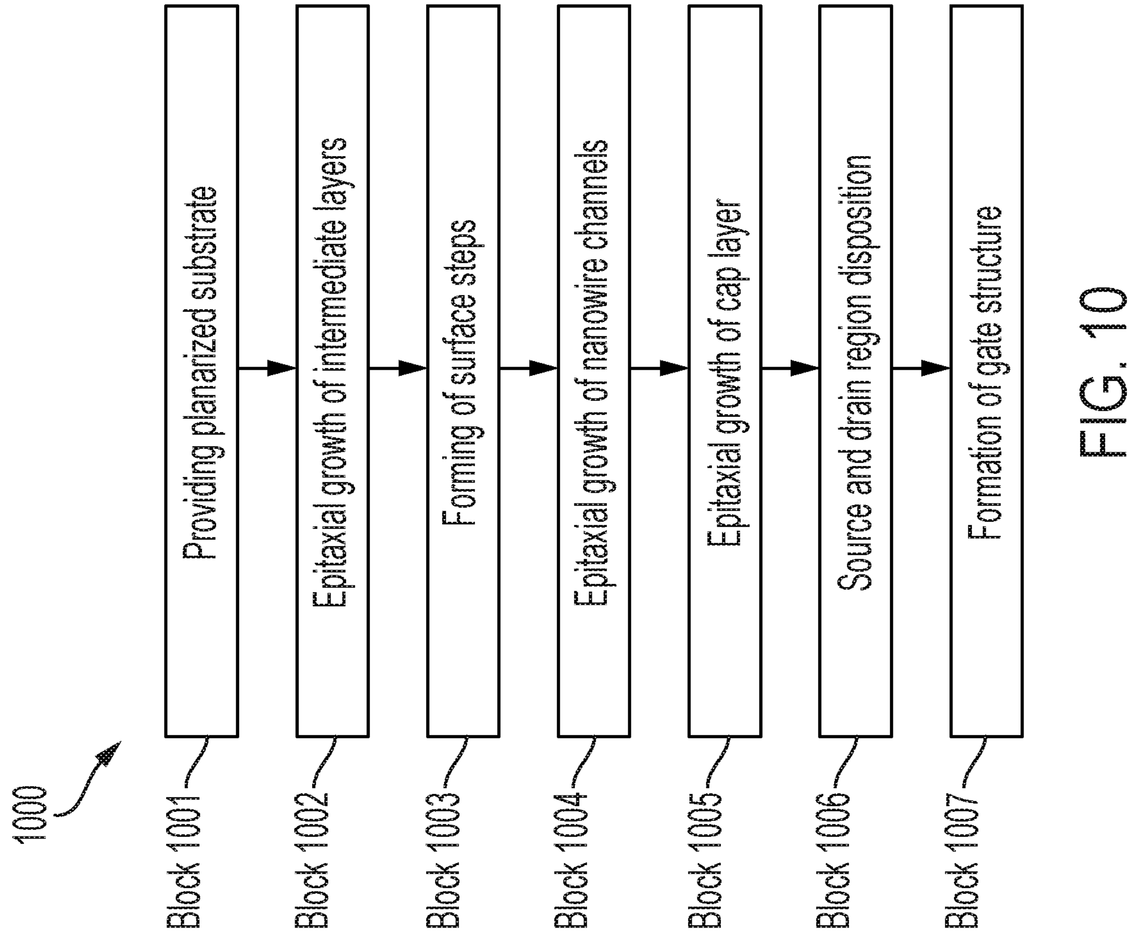
FIG. 10 is a flow diagram illustrating a method of building a semiconductor device with a planarized substrate and a surface step forming operation in accordance with embodiments.

With reference to FIG. 10, a method 1000 of building an RF transistor device, such as the RF transistor device 101 described above, is provided. The method 900 includes providing a planarized substrate (block 1001), epitaxially growing intermediate layers on the planarized substrate (block 1002) and forming surface steps in an uppermost surface of the intermediate layers (block 1003) by one of etching and machining. The method 1000 further includes epitaxially growing nanowire channels, with each nanowire channel being epitaxially grown on a corresponding one of the surface steps to form segmented active regions (block 1004) and epitaxially growing a cap layer on the nanowire channels and exposed portions of the uppermost surface (block 1005).

The method 1000 can further include disposing source and drain regions in electrical communication with opposite ends of each of the nanowire channels (block 1006) and disposing a gate structure between the source and drain regions and about each of the nanowire channels (block 1007). In accordance with embodiments, the epitaxially growing of the intermediate layers, the nanowire channels and the cap layer of blocks 1002, 1004 and 1005 can be conducted via metalorganic chemical vapor deposition or metalorganic vapor phase epitaxy and can be executed in a continuous manner. Such continuous epitaxial growth can be enabled by switching between precursor materials without removal of wafer material from the growth chamber and proceeding with epitaxial growth without stopping or at least without stopping for any significant amount of time. The continuous epitaxial growth contributes significantly to the absence of impurities at the interface associated with removal of the wafer from the growth chamber, which is often done when having to pattern the material. These impurities reduce the performance of the device.

In accordance with further embodiments, materials used in the epitaxially growing of the intermediate layers, the nanowire channels and the cap layer of blocks 1002, 1004 and 1005 can include at least one or more of aluminum nitride, gallium nitride, indium nitride, aluminum gallium nitride and alloys thereof and indium gallium nitride and alloys thereof. Precursor materials can include at least one or more of trimethylaluminium, trimethylgallium, triethylgallium, trimethylindium, triethylindium, ammonia, hydrazine, and dimethylhydrazine.

The epitaxially growing of the intermediate layers, the nanowire channels and the cap layer of blocks 1002, 1004 and 1005 results in a self-assembled formation of a segmented channel region that would otherwise need to be formed via a process of etching or regrowth. Those conventional processes would tend to introduce damage and/or impurities near sensitive portions of the device and thus degrade performance.

In accordance with embodiments, the epitaxially growing of the intermediate layers, the nanowire channels and the cap layer of blocks 1002, 1004 and 1005 can include one or more of N-polar growth, Ga-polar growth, m-plane growth and semipolar growth. In addition, the epitaxially growing of the nanowire channels of block 1004 can be executed such that the segmented active regions and the nanowire channels are provided in multiple layers.

Technical effects and benefits of the present disclosure are the provision of an RF transistor device in which heat can be transferred between the buffer and cap layers without an interfacial thermal boundary resistance. Also, multiple parallel conducting channels are created in-plane, with increased thermal conductivity in the vertical direction. By removing interfaces, heat can be dissipated relatively rapidly, and device operating temperatures will tend to decrease thus increasing device lifetimes. This in turn allows for higher power densities while maintaining lifetime metrics in RF applications.

The corresponding structures, materials, acts, and equivalents of all means or step-plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A semiconductor device, comprising:

a miscut substrate having a lowermost substrate surface defining a first horizontal plane and an upper substrate surface extending horizontally along a second horizontal plane, which is parallel with the first horizontal plane, with horizontally aligned miscut sections, each one of the horizontally aligned miscut sections being angled with respect to the horizontal plane;

intermediate layers epitaxially grown on the miscut substrate such that an uppermost surface of the intermediate layers, which extends horizontally along a third horizontal plane that is parallel with the first and second horizontal planes, and which comprises horizontally aligned surface steps, each one of the horizontally aligned surface steps being respectively associated with a corresponding one of the horizontally aligned miscut sections;

segmented active regions comprising nanowire channels, each of which is epitaxially grown on a corresponding one of the surface steps; and a cap layer epitaxially grown on the nanowire channels and exposed portions of the uppermost surface.

2. The semiconductor device according to claim 1, wherein there is an absence of high thermal boundary resistance between the nanowire channels, the intermediate layers and the cap layer.

3. The semiconductor device according to claim 1, wherein:

cross-sectional shapes of the segmented active regions are one or more of triangular, square, rectangular and trapezoidal, and the intermediate layers and the nanowire channels have various crystallographic orientations comprising at least one or more of N-polar, Ga-polar, m-plane and semipolar.

4. The semiconductor device according to claim 1, wherein the intermediate layers, the cap layer and the nanowire channels each comprise at least one or more of aluminum nitride, gallium nitride, indium nitride, aluminum gallium nitride and alloys thereof and indium gallium nitride and alloys thereof.

5. The semiconductor device according to claim 1, wherein the segmented active regions are provided in multiple layers.

6. The semiconductor device according to claim 1, further comprising:

source and drain regions disposed in electrical communication with opposite ends of each of the nanowire channels; and a gate structure disposed between the source and drain regions and about each of the nanowire channels.

7. A method of building a semiconductor device, the method comprising:

providing a miscut substrate having a lowermost substrate surface defining a first horizontal plane and an upper substrate surface extending horizontally along a second horizontal plane, which is parallel with the first horizontal plane, with horizontally aligned miscut sections, each one of the horizontally aligned miscut sections being angled with respect to the horizontal plane;

epitaxially growing intermediate layers on the miscut substrate such that an uppermost surface of the intermediate layers, which extends horizontally along a third horizontal plane that is parallel with the first and second horizontal planes, and which comprises horizontally aligned surface steps, growth of each one of the horizontally aligned surface steps being respectively caused by a corresponding one of the horizontally aligned miscut sections;

epitaxially growing nanowire channels, with each nanowire channel being epitaxially grown on a corresponding one of the surface steps to form segmented active regions; and epitaxially growing a cap layer on the nanowire channels and exposed portions of the uppermost surface.

8. The method according to claim 7, wherein the epitaxially growing of the intermediate layers, the nanowire channels and the cap layer comprises metalorganic chemical vapor deposition (CVD).

9. The method according to claim 7, wherein:

materials of the epitaxially growing of the intermediate layers, the cap layer and the nanowire channels comprise at least one or more of aluminum nitride, gallium nitride, indium nitride, aluminum gallium nitride and alloys thereof and indium gallium nitride and alloys thereof, and precursor materials comprise at least one or more of trimethylaluminium, trimethylgallium, triethylgallium, trimethylindium, triethylindium, ammonia, hydrazine, and dimethylhydrazine.

10. The method according to claim 7, wherein the epitaxially growing of the intermediate layers, the nanowire channels and the cap layer is continuous.

11. The method according to claim 7, wherein the epitaxially growing of the intermediate layers, the nanowire channels and the cap layer comprises one or more of N-polar growth, Ga-polar growth, m-plane growth and semipolar growth.

12. The method according to claim 7, wherein the epitaxially growing of the nanowire channels is executed such that the segmented active regions are provided in multiple layers.

13. The method according to claim 7, further comprising:

disposing source and drain regions in electrical communication with opposite ends of each of the nanowire channels; and disposing a gate structure between the source and drain regions and about each of the nanowire channels.

* * * * *